United States Patent [19]
Suzuki et al.

[11] Patent Number: 5,578,521
[45] Date of Patent: Nov. 26, 1996

[54] SEMICONDUCTOR DEVICE WITH VAPORPHASE GROWN EPITAXIAL

[75] Inventors: Yasutoshi Suzuki, Okazaki; Takamasa Suzuki, Nagoya; Kunihiko Hara, Aichi-ken; Hajime Inuzuka, Nishio; Naomi Awano, Nagoya; Kouichi Hoshino, Oobu, all of Japan

[73] Assignee: Nippondenso Co., Ltd., Kariya, Japan

[21] Appl. No.: 432,637

[22] Filed: May 3, 1995

Related U.S. Application Data

[63] Continuation of Ser. No. 845,812, Mar. 9, 1992, abandoned, which is a continuation of Ser. No. 420,721, Oct. 11, 1989, abandoned, which is a continuation of Ser. No. 123,549, Nov. 20, 1987, abandoned.

[30] Foreign Application Priority Data

Nov. 20, 1986 [JP] Japan .................................. 61/277592
Nov. 26, 1986 [JP] Japan .................................. 61/281252

[51] Int. Cl.⁶ .................................................. C30B 25/14
[52] U.S. Cl. ........................ 437/112; 437/81; 437/107; 437/116; 437/132; 117/94; 117/95; 117/954
[58] Field of Search .............................. 117/94, 95, 954; 437/81, 82, 107, 111, 112, 116, 132, 946, 973; 148/DIG. 25, DIG. 51, DIG. 65, DIG. 72, DIG. 91, DIG. 110, DIG. 119, DIG. 148, DIG. 169

[56] References Cited

U.S. PATENT DOCUMENTS

| | | | |
|---|---|---|---|
| 4,699,688 | 10/1987 | Shastry | 156/606 |
| 4,707,216 | 11/1987 | Morkoc et al. | 156/610 |

FOREIGN PATENT DOCUMENTS

| | | |
|---|---|---|
| 52-58363 | 5/1977 | Japan . |
| 61-91098 | 5/1986 | Japan . |

OTHER PUBLICATIONS

Akiyama et al. "Growth of GaAs on Si by MOCVD," J. Crys. growth, vol. 68 (1984), pp. 21–26.

Sugimura et al., "Heteroepitaxial Growth of GaAs on Sapphire Substrates by a three–step . . . " J. Crys. Growth, vol. 77(1986), pp. 524–529.

Akiyama et al., "Growth of High Quality GaAs Layers on Si Substrates by MOCVD," J. Crys. Growth, vol 77 (1986), pp. 490–497.

Mizuguchi et al., "MOCVD GaAs Growth on Ge(100) and Si(100) Substrates," J. Crys. Growth, vol. 77 (1986), pp. 509–514.

Chand et al., ". . . Rapid Thermal Annealing on Crystalline Quality of GaAs Grown on Si . . . ", J. Vac. Sci. Technol. B5(3), May/Jun 1987, pp. 822–826.

Duncan et al., ". . . Heteroepitaxial Gallium Ansenide on Silicon," J. Appl. Phys., 59(6), 15 Mar. 1986, pp. 2161–2164.

(List continued on next page.)

*Primary Examiner*—Robert Kunemund
*Attorney, Agent, or Firm*—Cushman Darby & Cushman, L.L.P.

[57] ABSTRACT

A silicon semiconductor substrate, on which an epitaxial layer is to be formed, is set in a reaction vessel having a heating mechanism, and a gas containing TMG and AsH$_3$ is introduced into the reaction vessel with the substrate heated to 450° C., thus forming, on the substrate, a low-temperature growth layer of amorphous or polycrystalline GaAs as a semiconductor substance having a different lattice constant from that of the substrate. Then, with the TMG removed from the introduced gas, the temperature of the semiconductor substrate is increased to 750° C., to cause coagulation of atoms of the low-temperature growth layer, with a thermal treatment also being performed at this high temperature, to cause growth of island-like single crystal cores. Further, a high temperature growth process is conducted in a material gas atmosphere containing TMG, whereby a GaAs film is epitaxially grown on the semiconductor substrate surface.

12 Claims, 6 Drawing Sheets

OTHER PUBLICATIONS

Lee et al., ". . . Annealing Properties of Molecular–Beam Epitaxy Grown GaAs–on–Si," J. Vac. Sci. Technol. B5(3), May/Jun 1987, pp. 827–830.

Fischer et al., "Dislocation Reduction in Epitaxial GaAs on Si(100)," Appl. Phys. Lett. 48(18), 5 May 1986, pp. 1223–1225.

Technology of the Institute of Electronics and Communications Engineers of Japan, report SSD 86–99–110.

J. Appl. Phys. 57(10), p. 4578–4582, May 1985 "Characterization of Epitaxially grown GaAs on Si substrates with III–V compounds intermediate layers by metalorganic chemical vapor deposition": Soga et al.

Japanese Journal of Applied Physics 23, NO. 11, PP. L843–L845, Nov., 1984 "Growth of Single Domain GaAs Layer on (100)–Oriented Si. Akiyama et al. Substrate by MOCVD."

Applied Electronics Report No. 415, "GaAs Growth on Si Substrate and its Application to Devices" Akiyama et al.

The Proceedings for 33rd Symposium on Applied Physics (4P–W–7).

Vernon et al., "Heteroepitaxial (Al)GaAs Structures on GE and Si . . . ", 17th IEEE Photovoltaic Specialists Conf., Kissimmee, Fl., May 1–4, 1984, pp. 434–439.

SEMICONDUCTOR DEVICE WITH VAPORPHASE GROWN EPITAXIAL

This is a continuation of application Ser. No. 07/845,812, filed on Mar. 9, 1992, which was abandoned upon the filing hereof which was a continuation of application Ser. No. 07/420,721 filed Oct. 11, 1989, now abandoned, which was a continuation of application Ser. No. 07/123,549 filed Nov. 20, 1987, now abandoned.

BACKGROUND OF THE INVENTION

This invention relates to a semiconductor device with a vapor-phase grown epitaxial layer, and to a method of manufacturing the same, more particularly, to a method for causing vapor-phase epitaxial growth, on the surface of a semiconductor substrate of silicon or the like, of GaAs or a like substance having a different lattice constant from that of the substrate, and to a semiconductor device having the vapor-phase epitaxial layer.

It is well known in the art that when fabricating a semiconductor device, an epitaxial layer is formed on a semiconductor substrate by causing vapor-phase growth on the substrate surface of a semiconductor having a different lattice constant from that of the substrate.

For instance, a Group III and V element compound semiconductor, e.g., GaAs or InP, is epitaxially grown on a semiconductor substrate, such as a silicon substrate. When a semiconductor of GaAs, InP, or a like compound is epitaxially grown on the silicon substrate surface, there is a lattice mismatch factor with respect to the silicon constituting the substrate. This factor is 4.1% in the case of GaAs and 8.1% with InP. Therefore, if a GaAs layer is formed on a silicon substrate by growing GaAs thereon, the resultant epitaxial layer will have considerable defects and inferior surface shape.

With the aim of solving this problem, it has been proposed to form an intermediate layer as a super-lattice constitution element between the silicon substrate and GaAs layer, so as for this intermediate layer to absorb the lattice mismatch between silicon and GaAs, this method being disclosed in Japanese Patent Laid-Open Publication Sho 61 (1985) - 91,098.

However, where such an intermediate layer is formed, mixture crystal and very thin films must be controlled repeatedly in the epitaxial layer formation process, and complicated process control is required.

It is taught to cause growth of GaAs directly on a silicon substrate, and it is well known that a mirror surface can be obtained by means of a two-step growth process. In this case, however, a resultant hetero-epitaxial layer contains a large number of transitions and other defects.

For example, when a thin film of GaAs is formed on a silicon substrate, warping of the resultant wafer results when a high level of heat is applied thereto, due to silicon and GaAs having different coefficients of thermal expansion.

SUMMARY OF THE INVENTION

An object of the invention is to provide a method for causing epitaxial growth of a layer of GaAs or a like substance, on a semiconductor substrate of silicon or the like.

Another object of the invention is to provide a method of causing vapor-phase epitaxial growth, which permits an epitaxial layer having less transitions and of sufficient quality to be formed when GaAs is epitaxially grown on a semiconductor substrate by means of a two-step growth process.

Another object of the invention is to provide a semiconductor device the semiconductor substrate of which is free from warping or like deformation, even if it has an epitaxial growth layer composed of a substance having a different coefficient of thermal expansion from that of the semiconductor device, and a method of manufacturing the same semiconductor device.

More specifically, using the method of vapor-phase epitaxial growth according to the invention, a semiconductor substance having a different lattice constant from that of the substrate is formed by low temperature growth as amorphous crystal, polycrystal, or bicrystal on the semiconductor substrate, and subsequently the resultant thin film, having been grown, is rendered into an island-like single crystal. Then, high temperature growth of this island-like single crystal is caused to happen, whereby a growth layer of the semiconductor substance is formed on the semiconductor substrate surface.

In the above way, in a first step, a low temperature growth layer is formed as a GaAs thin film, for instance, by low temperature growth on the semiconductor substrate. This thin film is thermally treated to form an island-like single crystal, which is then subjected to high temperature heat treatment, whereby a high quality epitaxial growth layer having less transitions can be obtained.

Such epitaxial layers are formed on both sides of a semiconductor substrate. By so doing, the generation of warping or like deformation of the semiconductor substrate can be eliminated, as a result of which a highly reliable semiconductor integrated circuit or the like can be obtained, even when the semiconductor substances constituting the semiconductor substrate and epitaxial growth layer have different coefficients of thermal expansion.

DETAILED DESCRIPTION OF THE PREFERRED EMBODIMENTS

Figure 1:
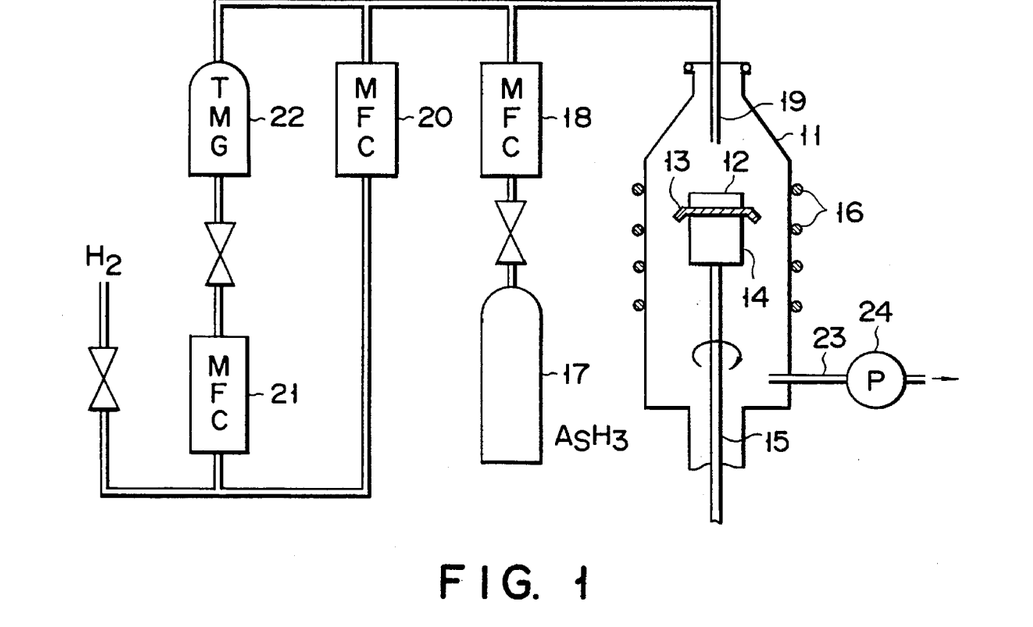
FIG. 1 is a schematic view showing an apparatus for carrying out an embodiment of the vapor-phase epitaxial growth method according to the invention.

FIG. 1 shows an apparatus for forming an epitaxial growth layer on a semiconductor substrate. The apparatus comprises reaction vessel 11 made of quartz.

Semiconductor substrate 12, of silicon for instance, on which an epitaxial growth layer is to be formed, is placed on quartz tray 13, which is then disposed in reaction vessel 11. Quartz tray 13 with semiconductor substrate 12 thereon, is transported from a load lock chamber (or a spare chamber) by an automatic or manual transport mechanism into reaction vessel 11. Quartz tray 13 is supported on graphite susceptor 14. Susceptor 14 is supported by work coil 15. By work coil 15, susceptor 14 is disposed together with semiconductor substrate 12 at a predetermined position in reaction vessel 11.

High frequency induction coil 16 is disposed such that it surrounds reaction vessel 11. High frequency power is supplied selectively to high frequency coil 16. Semiconductor substrate 12 is induction heated with the high frequency power being supplied. Although not particularly shown in the Figure, work coil 15 is provided with a temperature sensor consisting of a thermocouple or the like. The temperature sensor detects the temperature of semiconductor substrate 12. The high frequency power supplied to induction coil 16 is controlled according to a detection signal from the temperature sensor, and the operating temperature, i.e., growth temperature of semiconductor substrate 12, is controlled with high accuracy.

Material gas ($AsH_3$) is supplied from material gas vessel 17 through mass flow controller 18 into reaction vessel 11. Accurately flow-controlled material gas is supplied form nozzle 19 into reaction vessel 11, so that it can be sprayed against the epitaxial growth surface of semiconductor substrate 12.

$H_2$ gas is supplied as carrier gas through mass flow controller 20 into reaction vessel 11. The $H_2$ carrier gas is supplied through mass flow controller 21 into trimethyl gallium (TMG) vessel 22. A material gas, for example, trimethyl gallium is supplied to nozzle 19 to be injected into reaction vessel 11.

Reaction vessel 11 is provided with discharge port 23, in which oil pump 24 is provided to forcibly discharge gas from reaction vessel 11. During the growth, the interior of reaction vessel 11 is held under atmospheric pressure. When causing reduced pressure growth, the gas in reaction vessel 11 is discharged through discharge port 23, so that the interior of reaction vessel 11 is held under a predetermined reduced pressure.

To uniformalize the thickness of the growth layer formed on the surface of semiconductor substrate 12, susceptor 14 is rotated by work coil 15, so that semiconductor substrate 12 is rotated with its surface is coincident with the surface of susceptor 14. In reaction vessel 11, a GaAs film is formed on the surface of semiconductor substrate 12. The growth of the GaAs film is carried out according to a temperature program shown in FIG. 2.

In a process for causing the growth of an GaAs film on the surface of semiconductor substrate 12, semiconductor substrate 12 consisting of silicon is placed on quartz tray 13, which is then transported from a preparation chamber (not shown) to susceptor 14 in reaction vessel 11. Semiconductor substrate 12 is disposed at a predetermined position in reaction vessel 11 by work coil 15. In this state, high frequency power is selectively supplied to high frequency coil 16, thus permitting selective temperature increase control of semiconductor substrate 12.

The process of control in the interior of reaction vessel 11 will now be described with reference to a temperature program shown in FIG. 2. The temperature of the interior of reaction vessel 11 is increased from room temperature to 450° C. with semiconductor substrate 12 disposed at a predetermined position in reaction vessel 11. When the temperature is elevated to 450° C., it is held at this value, and in this state trimethyl gallium (TMG) and arsine ($AsH_3$) as material gas are introduced in predetermined quantities together with the carrier gas ($H_2$) from nozzle 19 into reaction vessel 11 such that these gases touch the surface of semiconductor substrate 12. As shown in FIG. 3A, thin film 31 of GaAs is low-temperature grown on the surface of semiconductor substrate 12.

Figure 4:
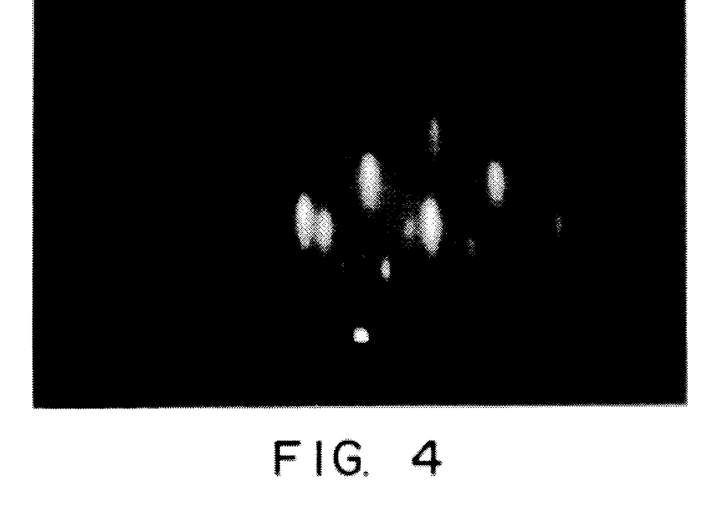
FIGS. 4 and 5 are photographs of the crystal structure of a growth layer resulting from use of the epitaxial growth process noted above.

The thickness of GaAs thin film 31 formed on the surface of semiconductor substrate 12 is suitably about 100 angstroms, and GaAs is suitably amorphous, polycrystalline and bicrystalline. FIG. 4 shows a (RHEED) image of the GaAs layer obtained by the low-temperature growth.

When GaAs thin film 31 is formed in this way by the low-temperature growth, the supply of trimethyl gallium is stopped, and the temperature of semiconductor substrate 12 is elevated up to 750° C. in an atmosphere consisting of $AsH_3$ and $H_2$ gases. Then the temperature is stablized at 750° C., the system is subjected to a thermal treatment for about 5 minutes in the atmosphere noted above.

Figure 3A:
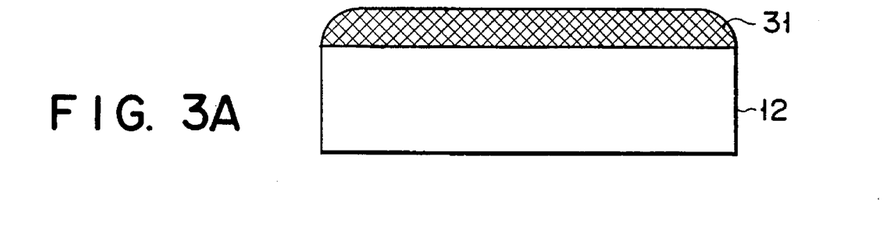
FIGS. 3A to 3E are views for explaining an epitaxial layer growth process when epitaxial growth is caused according to the temperature program.
Figure 3B:
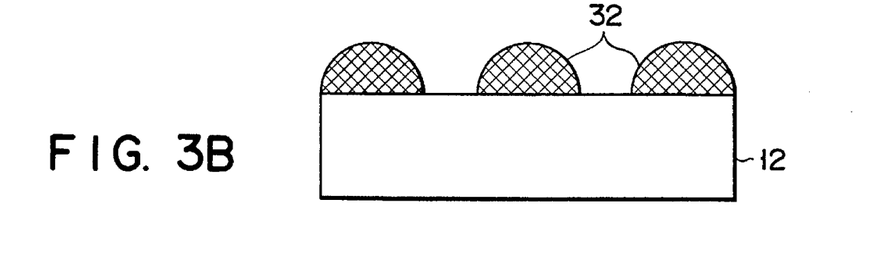
Figure 3C:
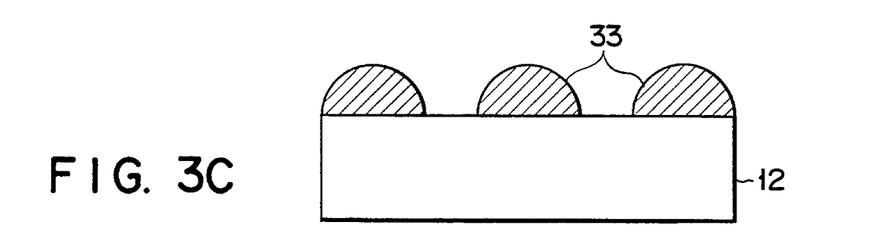

In the step of the temperature increase up to 750° C., GaAs thin film 31 formed by the low-temperature growth on the surface of semiconductor substrate 12, is like island 32 consisting of coagulation of atoms as shown in FIG. 3B, and island-like single crystal cores 33 as shown in FIG. 3C are formed by a thermal treatment in a temperature state at 750° C. Through such thermal treatment, the lattice mismatch between semiconductor substrate 12 consisting of silicon and GaAs film grown on the surface of substrate 12 is alleviated.

Figure 5:
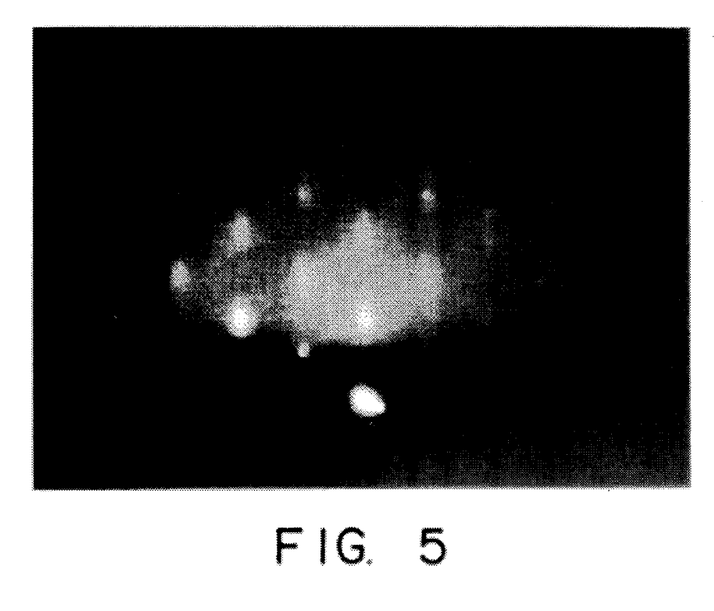

FIG. 5 shows a RHEED image, in which island-like single crystal cores are formed on semiconductor substrate 11. It will be seen that island-like single crystals can be clearly recognized.

After this thermal treatment, the temperature of semiconductor substrate 12 in reaction vessel 11, i.e., growth temperature, is reduced to 650° C. In the state of the reduced temperature, trimethyl gallium is supplied together with $AsH_3$ and carrier gas $H_2$ into reaction vessel 11.

Figure 3D:
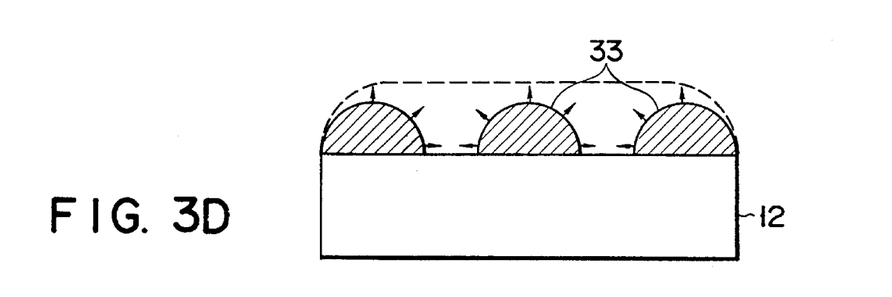
Figure 3E:
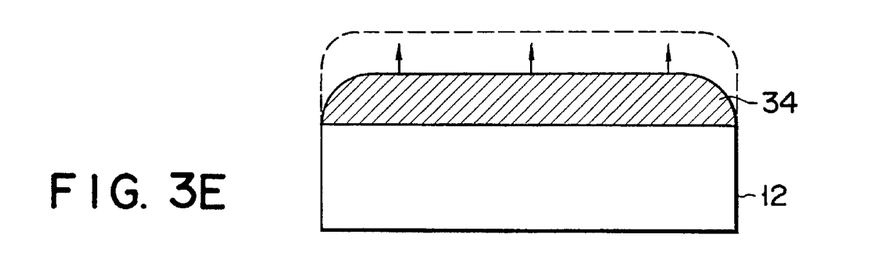

Further, the GaAs layer formed on semiconductor substrate 12 is subjected to growth in the transversal direction as shown in FIG. 3D, and then the GaAs layer is subjected to homoepitaxial growth up to a desired thickness as shown in FIG. 3E.

Epitaxial growth layer 34 of GaAs formed in this way, is thought to have high efficiency of photoluminecsence, and it constitutes a GaAs heteroepitaxial growth device having high crystal property.

When the GaAs layer formed obtained by the low-temperature growth becomes as thick as approximately 1,000 angstroms so that island-like single crystals are formed by a thermal treatment at 750° C., an intent to cause growth of an GaAs film by supplying trimethyl gallium at 650° C. leads to the formation of a film having inferior crystal property due to inferior surface homology of the growth layer.

Figure 2:
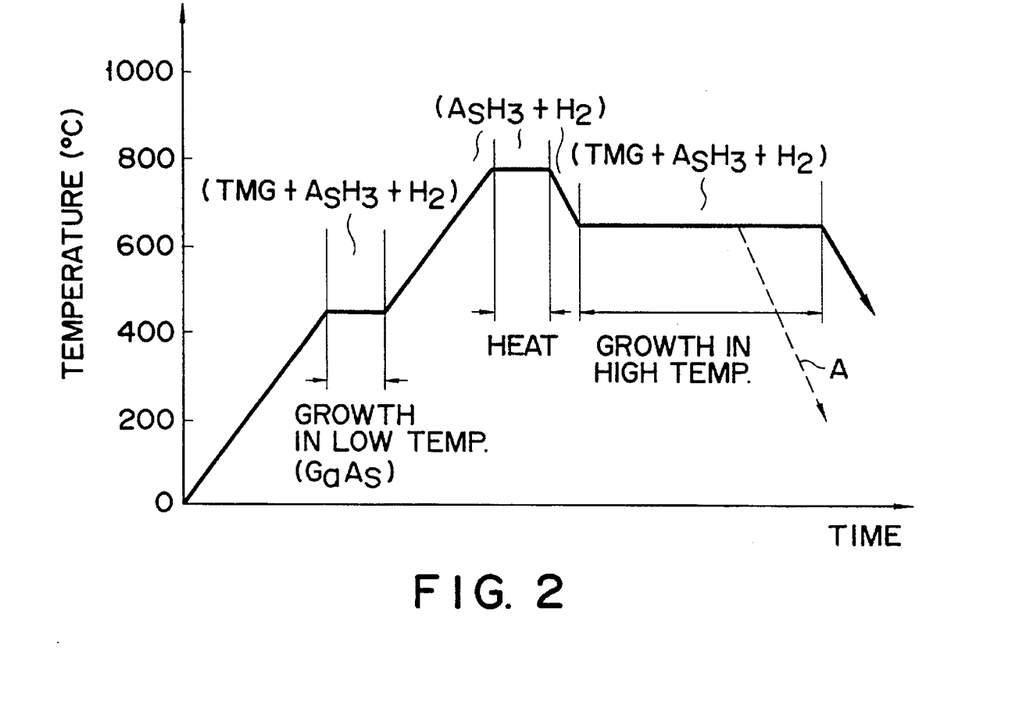
FIG. 2 is a graph showing a temperature program used when causing epitaxial growth by means of the apparatus shown in FIG. 1.

When the high temperature growth process for causing growth of single crystals is omitted as shown by dashed line A in the temperature program shown in FIG. 2, the GaAs growth layer formed on the surface of semiconductor substrate 12 has inferior surface homology, and the crystal property is inferior.

Figure 6:
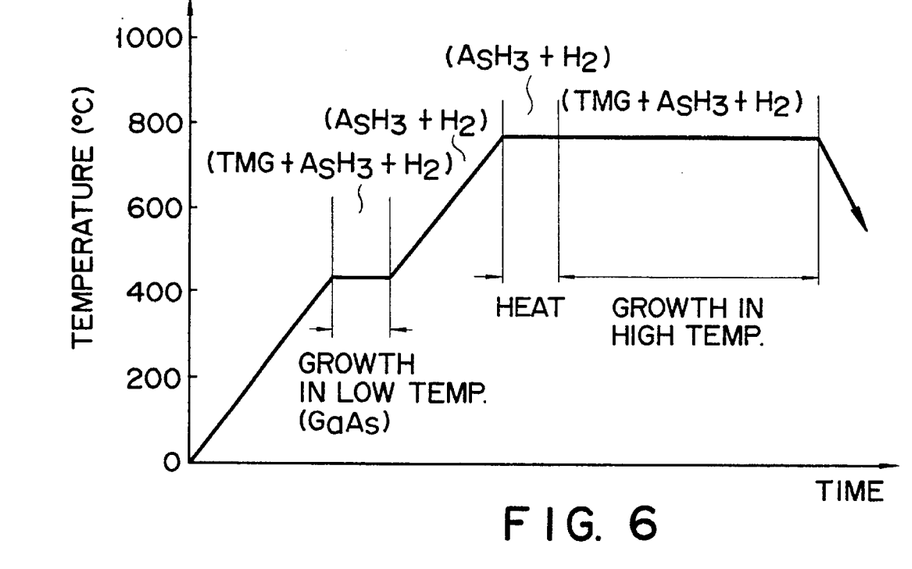
FIG. 6 is a graph showing a growth temperature program for explaining a second embodiment of the vapor-phase epitaxial growth method according to the invention.

FIG. 6 shows a different example of the temperature program in a vapor-phase epitaxial growth process shown in FIG. 6. In this example, the high temperature growth process for causing growth of single crystals is performed in an atmosphere at a temperature of 750° C. like a 750° C. thermal treatment process for forming island-like single crystal cores. More specifically, after island-like single crystal cores have been formed through a thermal treatment at a high temperature of 750° C. in an atmosphere "AsH$_3$+H$_2$", at the same temperature trimethyl gallium is introduced into reaction vessel 11 for causing high temperature growth of the GaAs layer.

The embodiments so far have concerned with the case of causing epitaxial growth of the GaAs layer on a silicon substrate. However, even in case when the GaAs layer is grown on SOS (silicon on sapphire), a crystal grown layer is obtained by a similar epitaxial growth method. Further, the semiconductor substance to be grown, is not limited to GaAs, but similar growth methods can be carried out even in case when such semiconductor substance as AlGaAs, InP and SiC is formed on a semiconductor substrate having a different lattice constant from that of such semiconductor substance.

The technique of causing epitaxial growth of GaAs on a silicon substrate formed on the embodiment, is effective for the formation of ICs utilizing GaAs having large areas and substrates for solar batteries, and it has high usefulness for the realization of GaAs/Si compound integrated circuit in which a GaAs device is formed on a silicon IC.

Figure 7:
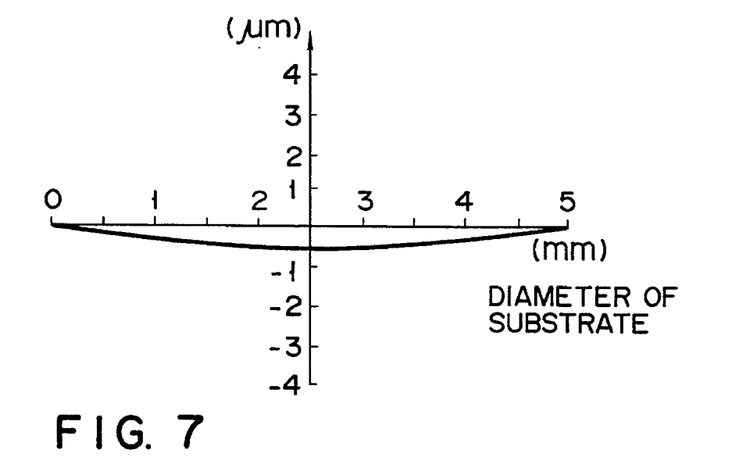
FIG. 7 is a view showing warping when an epitaxial growth layer is formed on one surface of a semiconductor substrate.

Assuming a case when a GaAs thin film is formed on the surface of a silicon substrate, while the coefficient of thermal expansion of GaAs is $2.6\times10^{-6}°C.^{-1}$ the coefficient of thermal expansion of silicon is $5.9\times10^{-6}°C.^{-1}$. Thus, when a GaAs thin film is formed by crystal growth directly on the silicon substrate, a strong tensile force is produced in the GaAs thin film according to temperature changes, and a force for generating the warping as shown in FIG. 7 acts on the silicon substrate. Where the thickness of the GaAs thin film exceeds 3 to 4 μm, a problem of generation of cracks is posed.

FIG. 7 shows the results of measurement of the warping of the silicon substrate on a sample, with a silicon substrate diameter of 5 mm, a substrate thickness of 500 μm and a GaAs thin film thickness of 4.6 μm, using a probe-type step gauge.

Figure 8:
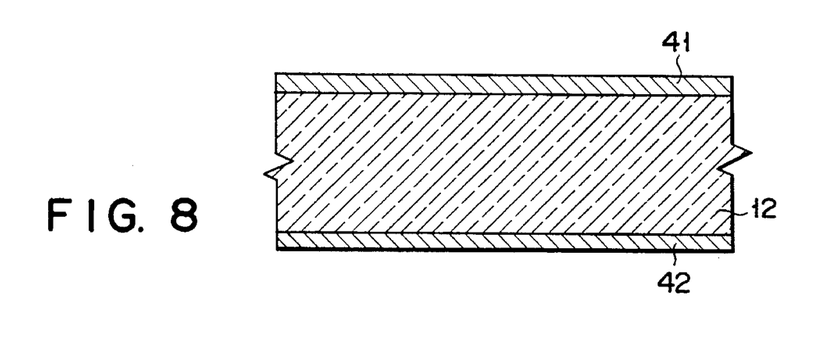
FIG. 8 is an exaggerated sectional view showing a semiconductor device having vapor-phase epitaxial layers.

FIG. 8 is a sectional view showing a semiconductor device constructed by taking the foregoing into considerations. Semiconductor substrate 12 consisting of silicon has a thickness of 500 μm. GaAs thin films 41 and 42 are formed on the two principal surfaces of substrate 12. GaAs thin films 41 and 42 have substantially a uniform thickness. For example, the thickness is set to 4.6 μm.

Figure 9:
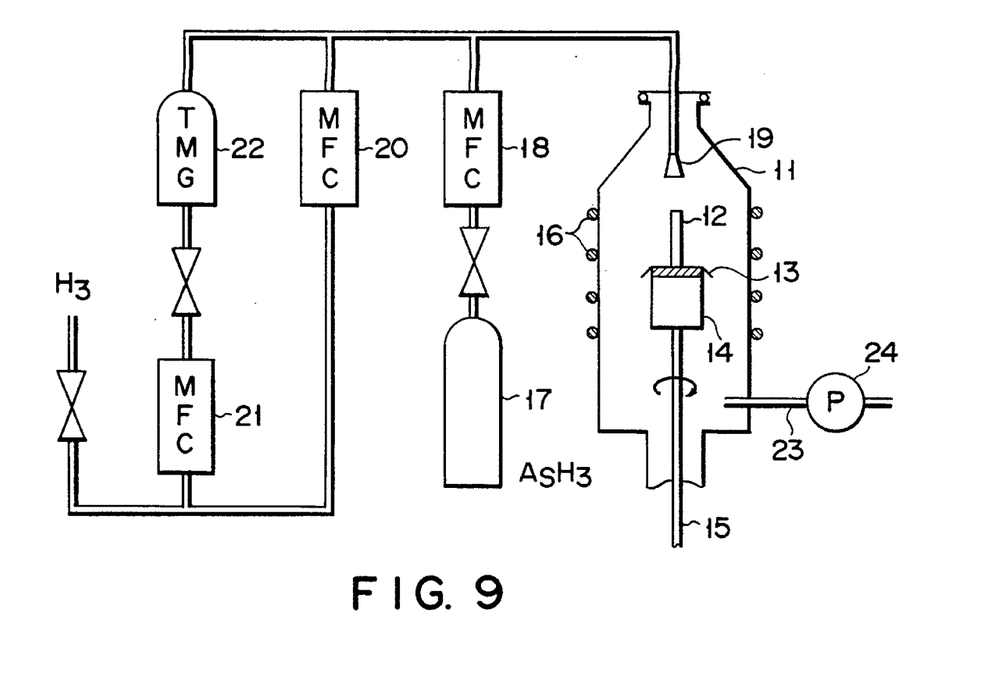
FIG. 9 is a schematic view showing an apparatus used for epitaxial growth when fabricating the semiconductor device as shown in FIG. 8.

Such GaAs thin films 41 and 42 are formed by vapor-phase epitaxial growth using the apparatus as shown in FIG. 9.

The apparatus shown in FIG. 9 is basically the same as the apparatus shown in FIG. 1, and like parts are designated by like reference numerals. With this apparatus, semiconductor substrate 12 is erected on quartz tray 13 in reaction vessel 11 such that its opposite surfaces are exposed. Nozzle 19 is disposed above semiconductor device 12, such that reaction gas issued from nozzle 19 effectively touches the opposite surfaces of semiconductor substrate 12.

By setting semiconductor substrate 12 in reaction vessel 11 and effecting epitaxial growth treatment according to the temperature program as shown in FIGS. 2 or 6, thin films 41 and 42 consisting of a semiconductor substrate are formed to an equal thickness on the opposite surfaces of semiconductor substrate 12.

Figure 10:
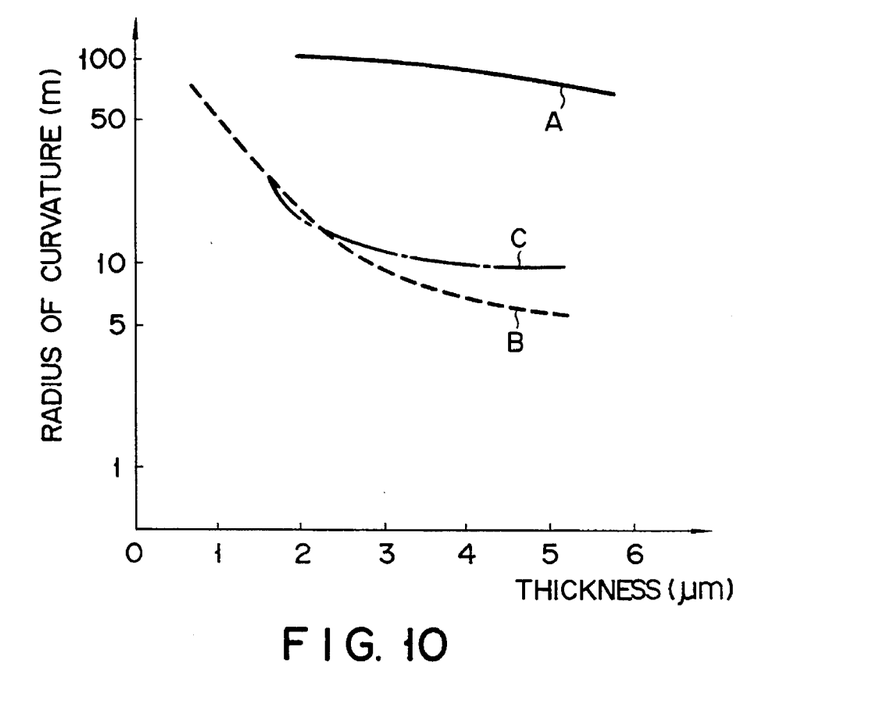
FIG. 10 is a graph for explaining the relation between the thickness of epitaxially grown GaAs thin film and the radius of curvature of warping of the semiconductor substrate.

FIG. 10 shows the results of measurement of the warping of substrate conducted by the inventor. The abscissa is taken for the thickness of the GaAs thin film, and the ordinate is taken for the logarithmic scale of the radius of curvature of the substrate. In the Figure, solid curve A shows an example of growth of GaAs thin films 41 and 42 formed on the opposite surfaces of semiconductor substrate 12 as shown in FIG. 8. The dashed curve B shows an example of growth of the GaAs thin film formed on one surface of the semiconductor substrate. The phantom line curve C shows an example of the growth of a GaAs thin film on approximately 2,000 angstrom intermediate layers of of GaP/GaAsP and GaAsP/GaAs formed on the semiconductor substrate.

The thickness of the ordinary GaAs thin film is 3 to 5 μm. As is apparent from the results of measurement, with the semiconductor device as shown in FIG. 8 having the characteristic A, the radius of curvature of is greater by approximately one only of magnitude than that of the prior art structures having the characteristics B and C.

More specifically, with the semiconductor device shown in FIG. 8, ICs are formed on GaAs thin film 41 formed on one principal surface of semiconductor substrate 12, and GaAs thin film 42 on the other principal surface is formed to reduce the generation of warping of substrate 12. However, thin film 42 has a thickness of approximately 1/100 of the thickness of semiconductor substrate 12, and the thermal conductivity of substrate 12 is not influenced by thin film 42. Further, it is of course possible to form ICs on GaAs thin film 42 on the other principal surface.

Figure 11:
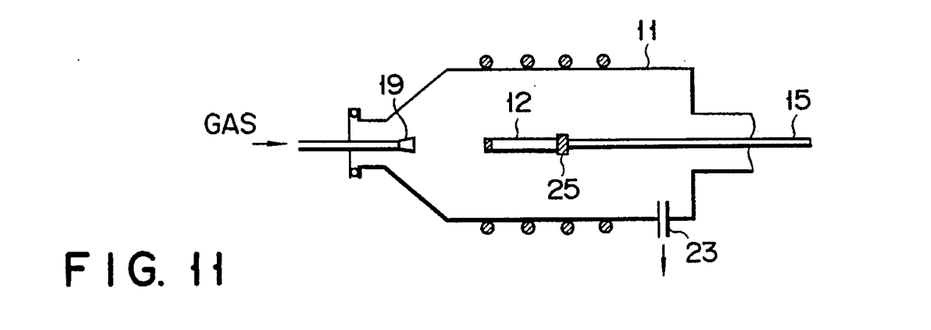
FIGS. 11 to 13 are views showing respective examples of apparatuses used forming an epitaxial growth layer on each principal surface of the semiconductor substrate.

To form vapor-phase epitaxial growth layers on the opposite sides of the semiconductor substrate, reaction vessel 11 may be modified as shown in FIG. 9. Also, it is possible to construct reaction vessel 11 to be horizontal as shown in FIG. 11. In this case, semiconductor substrate 12 is held by holder 25 or the like mounted on work coil 15 such that the reaction gas issued form nozzle 19 touches the opposite surfaces of semiconductor substrate 12.

Figure 12:
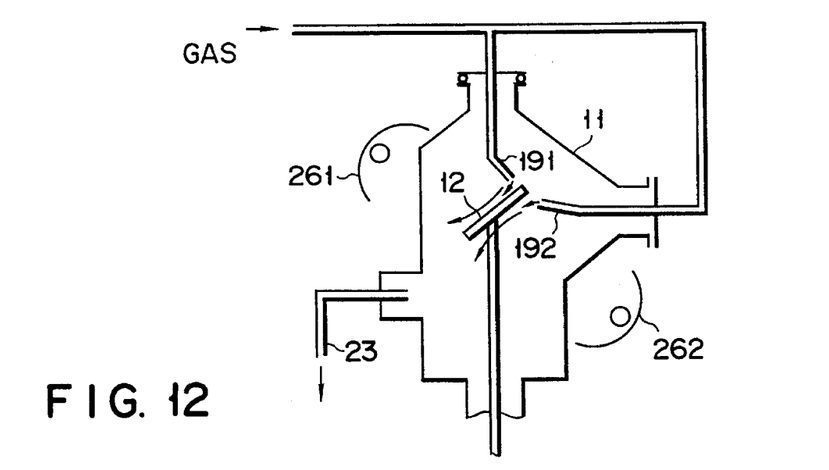

FIG. 12 shows a further example of reaction vessel 11. Semiconductor substrate 12 is set in reaction vessel 11 in an inclined state, and two nozzles 191 and 192 are set such that reaction gas is supplied to the opposite side surfaces of semiconductor substrate 12. The same gas is supplied from nozzles 191 and 192 to flow along the opposite surfaces of semiconductor substrate 12.

In order to prevent vortex flow of material gas supplied from nozzles 191 and 192, it is necessary to consider the amount of gas supplied, and the shape and positional relation of nozzles 191 and 192 and reaction vessel 11.

In the embodiment so far, high frequency induction coils are used for heating semiconductor substrate 12 in reaction vessel 11, and high frequency power supplied to the induction coils is controlled so that semiconductor substrate 12 is heated selectively and in a temperature controlled state.

However, semiconductor substrate 12 may be heated by various other means as well. For example, it is possible to use infrared lamps 261 and 262 as shown in FIG. 12. In this case, it is possible to use stainless steel (SUS) instead of quartz as the material of reaction vessel 11.

Figure 13:
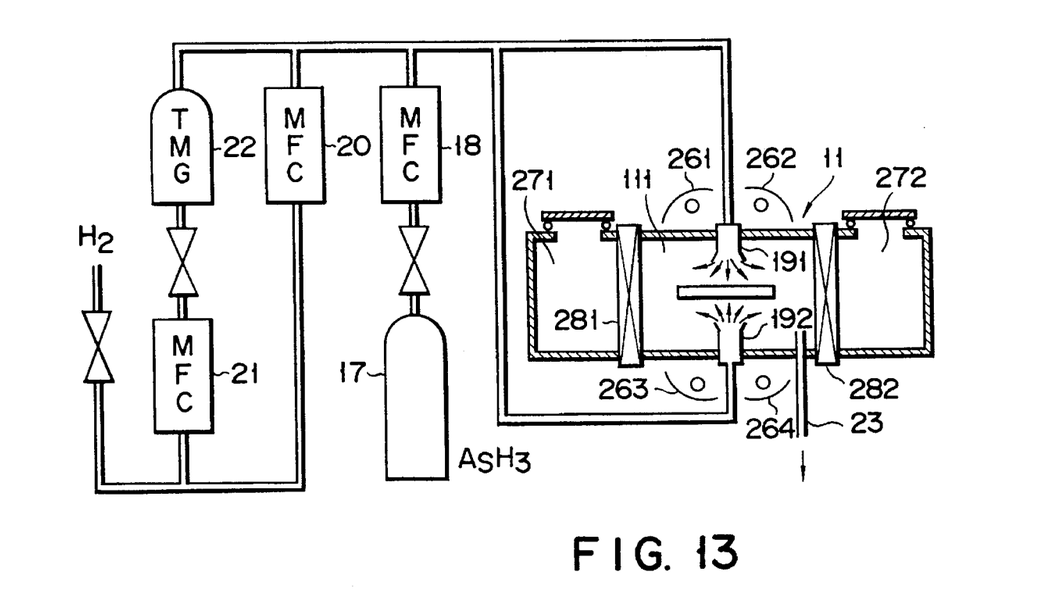

FIG. 13 shows a further example of reaction vessel. Reaction vessel 11 has reaction chamber 111 and first and second spare rooms 271 and 272 provided on the opposite sides. Reaction chamber 111 is defined with respect to first and second spare chambers 271 and 272 by gate valves 281 and 282. Semiconductor substrate 12 is transported by a transport mechanism utilizing a belt mechanism or $H_2$ gas. When gate valve 281 is open, substrate 12 is transported from first spare chamber 271 into reaction chamber 111. When gate valve 282 is open, it is transported from reaction chamber 111 to second spare chamber 272. Two nozzles 191 and 192 are provided in reaction chamber 111 such that they face each other. Semiconductor substrate 12 is transported to a position between nozzles 191 and 192. In its position between nozzles 191 and 192, substrate 12 is heated by infrared lamps 261 to 264.

In this apparatus, semiconductor substrate 12 is set in first spare chamber 271. Spare chamber 271 is evacuated to a vacuum degree of approximately 10 Torr by a turbomolecular pump and oil rotation pump (these pumps being not shown). Subsequently, $H_2$ gas is introduced into first spare chamber 271 to produce the same pressure condition as in reaction chamber 111. In this state, gate valve 281 is opened, and semiconductor substrate 12 is transported into reaction chamber 111.

In reaction chamber 111, it is located at a position between nozzles 191 and 192 as shown, and in this state material gas is supplied from nozzles 191 and 192. Then, semiconductor substrate 12 is temperature controlled and the contents of material gas are selected, whereby GaAs thin films are grown on the opposite sides of semiconductor substrate 12. When predetermined GaAs thin films have been grown on the opposite side surfaces of semiconductor substrate 12, gate valve 282 is opened, and semiconductor substrate 12 is transported into second spare room 272 to be taken out.

What is claimed is:

1. A method of manufacturing a semiconductor device having an epitaxial layer formed on a surface of a semiconductor substrate, said method comprising the steps of:

placing said substrate in a reaction chamber provided with heating means so as to permit selective setting of temperature of said semiconductor substrate;

forming a low-temperature growth layer, as a thin film having a thickness, on the surface of said semiconductor substrate, said thin film being formed of a semiconductor substance having a different lattice constant from that of said semiconductor substrate, said forming step including the steps of:
supplying a material gas which is a mixture of gases containing an organometallic gas as a material of said semiconductor substance into said reaction chamber, and
forming the semiconductor substance to a thickness less than 200 angstroms;

thermally treating the low-temperature growth layer at a temperature higher than that in said forming step, said temperature being sufficient for forming a plurality of island-like monocrystal cores from said thin film, said thermally treating step including the steps of:
stopping the supply of said organometallic gas,
elevating the temperature of said semiconductor substrate to about 750° C. to cause coagulation of the atoms of the semiconductor material constituting the low temperature growth layer formed in said forming step, and
maintaining the temperature of said semiconductor substrate at about 750° C. while the flow of said organometallic gas is stopped to reduce lattice mismatch between the island-like monocrystaline cores and the semiconductor substrate surface; and causing high-temperature growth of said semiconductor substance on said semiconductor substrate having said island-like monocrystal cores, said causing step including the step of supplying a material gas containing said organometallic gas as the material of said semiconductor substance into said reaction chamber while said semiconductor substrate is held at a high temperature, thereby generating epitaxial growth of said island-like monocrystal cores.

2. A method according to claim 1, wherein said semiconductor substrate consists of silicon, and said semiconductor substance is a Group III and V element compound semiconductor.

3. A method according to claim 2, wherein said Group III and V element compound semiconductor is GaAs.

4. A method according to claim 2, wherein said Group III and V element compound semiconductor is InP.

5. A method according to claim 1, wherein the material gas containing said semiconductor substance contains trimethyl gallium and arsine.

6. A method according to claim 1, further comprising the steps of:

setting said semiconductor substrate in said reaction chamber such that two principal surfaces of said semiconductor substrate are exposed;

forming a plurality of island-like monocrystal cores on the two principal surfaces during said thermally treating step; and simultaneously forming first and second thin films respectively on the two principal surfaces by epitaxially growing said monocrystal cores on each of said two principal surfaces during said causing step.

7. A method according to claim 6, wherein said causing step includes forming first and second semiconductor thin films having an equal thickness.

8. A method according to claim 1, wherein said placing step includes growing the thin film is in an amorphous or polycrystalline state at a low temperature.

9. A method for forming a GaAs layer on a silicon substrate, said method comprising the steps of:

placing a silicon substrate within a reaction chamber;

heating the silicon substrate to about 450° C.;

supplying a carrier gas, arsine and trimethyl gallium gas into the reaction chamber;

maintaining the silicon substrate at about 450° C. for a time, while continuously supplying the carrier gas, arsine and trimethyl gallium gas into the reaction chamber thereby forming a thin GaAs layer having a thickness at low temperature on the silicon substrate;

stopping the supply of trimethyl gallium gas into the reaction chamber;

raising the temperature of the silicon substrate to about 750° C. while continuously supplying only the carrier gas and arsine into the reaction chamber, thereby enabling the thin GaAs layer having the thickness on the silicon substrate to be transformed into island-shaped monocrystals;

maintaining the temperature of the silicon substrate at about 750° C. for a predetermined time to reduce a lattice mismatch between the island-shaped monocrystals and the silicon substrate; and supplying the carrier gas, arsine and trimethyl gallium gas into the reaction chamber;

lowering the temperature of the silicon substrate to about 650° C.; and maintaining the silicon substrate at about 650° C. for a time, while continuously supplying the carrier gas, arsine and trimethyl gallium gas into the reaction chamber, thereby growing the island-shaped GaAs monocrystals at high temperature on the silicon substrate, into a thick GaAs layer.

10. A method for forming a GaAs layer on a silicon substrate, said method comprising the steps of:

placing a silicon substrate within a reaction chamber;

heating the silicon substrate to about 450° C.;

supplying a carrier gas, arsine and trimethyl gallium gas into the reaction chamber;

maintaining the silicon substrate at about 450° C. for a time, while continuously supplying the carrier gas, arsine and trimethyl gallium gas into the reaction chamber thereby forming a thin GaAs layer having a thickness at low temperature on the silicon substrate;

stopping the supply of trimethyl gallium gas into the reaction chamber;

raising the temperature of the silicon substrate to about 750° C. while continuously supplying only the carrier gas and arsine into the reaction chamber, thereby enabling the thin GaAs layer having the thickness on the silicon substrate to be transformed into island-shaped monocrystals;

maintaining the temperature of the silicon substrate at about 750° C. for a predetermined time to reduce a lattice mismatch between the island-shaped monocrystals and the silicon substrate; and supplying the carrier gas, arsine and trimethyl gallium gas into the reaction chamber; and maintaining the silicon substrate at about 750° C. for a predetermined time, while continuously supplying the carrier gas, arsine and trimethyl gallium gas into the reaction chamber, thereby growing the island-shaped GaAs monocrystals at high temperature on the silicon substrate, into a thick GaAs layer.

11. A method according to claim 1, wherein said thin film formed on the surface of said semiconductor substrate has a thickness of approximately 100 angstroms.

12. A method of manufacturing a semiconductor device having an epitaxial layer formed on a surface of a semiconductor substrate, said method comprising the steps of:

placing said substrate in a reaction chamber provided with heating means so as to permit selective setting of temperature of said semiconductor substrate;

forming a low-temperature growth layer, as a thin film having a uniform thickness, on the surface of said semiconductor substrate, said thin film being formed of a semiconductor substance having a different lattice constant from that of said semiconductor substrate, said forming step including the step of supplying a material gas which is a mixture of gases containing an organometallic gas as a material of said semiconductor substance into said reaction chamber;

thermally treating the low-temperature growth layer at a temperature higher than that in said low-temperature growth layer forming step, thereby enabling said thin film having the uniform thickness to transform into a plurality of island-like monocrystal cores, said thermally treating step including the steps of:

stopping the supply of said organometallic gas of said semiconductor substance, elevating the temperature of said gases and of said semiconductor substrate to cause coagulation of the atoms of the semiconductor material constituting the low-temperature growth layer formed in said low-temperature growth forming step, and extending the thermally treating step to reduce a lattice mismatch between the island-like monocrystal cores and the semiconductor substrate surface; and causing high-temperature growth of said semiconductor substance on said semiconductor substrate having said island-like monocrystal cores, said causing step including the step of supplying a material gas containing said semiconductor substance into said reaction chamber while holding said semiconductor substance at a temperature lower than that of said thermally treating step, thereby generating epitaxial growth of said island-like monocrystal cores.

* * * * *